United States Patent
Hamberger et al.

(10) Patent No.: US 9,941,046 B2
(45) Date of Patent: Apr. 10, 2018

(54) CIRCUIT ARRANGEMENT FOR REDUCING A UNIDIRECTIONAL FLUX COMPONENT IN THE SOFT-MAGNETIC CORE OF A TRANSFORMER

(71) Applicant: Siemens Aktiengesellschaft, Munich (DE)

(72) Inventors: Peter Hamberger, Kirchschlag bei Linz (AT); Günther Weidenholzer, Sarleinsbach (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/411,474

(22) Filed: Jan. 20, 2017

(65) Prior Publication Data

US 2017/0213641 A1    Jul. 27, 2017

(30) Foreign Application Priority Data

Jan. 25, 2016   (EP) .................................... 16152567

(51) Int. Cl.

| | |
|---|---|
| *G05F 1/147* | (2006.01) |
| *H01F 27/34* | (2006.01) |
| *G01R 33/02* | (2006.01) |
| *H01F 27/10* | (2006.01) |
| *H01F 27/25* | (2006.01) |
| *H01F 27/38* | (2006.01) |

(Continued)

(52) U.S. Cl.
CPC ............ *H01F 27/34* (2013.01); *G01R 33/02* (2013.01); *H01F 27/10* (2013.01); *H01F 27/25* (2013.01); *H01F 27/38* (2013.01); *H01F 27/42* (2013.01); *H04M 19/003* (2013.01); *H01F 2029/143* (2013.01)

(58) Field of Classification Search
CPC . H01F 27/42; G05F 1/32; G05F 1/325; G05F 1/33; G05F 1/335
USPC .................................. 323/249, 250, 253, 356
See application file for complete search history.

(56) References Cited

U.S. PATENT DOCUMENTS

| | | | |
|---|---|---|---|
| 2013/0201592 A1* | 8/2013 | Hamberger ............. | H01F 27/38 361/157 |
| 2013/0207483 A1* | 8/2013 | Hamberger ............. | H01F 29/14 307/104 |

FOREIGN PATENT DOCUMENTS

| | | |
|---|---|---|
| CH | 403 944 | 12/1965 |
| EP | 2 622 614 | 8/2013 |
| WO | WO 2008/151661 | 12/2008 |

* cited by examiner

*Primary Examiner* — Alex Torres-Rivera
(74) *Attorney, Agent, or Firm* — Cozen O'Connor

(57) ABSTRACT

A circuit arrangement for reducing unidirectional flux component in a transformer core includes a compensation winding magnetically coupled to the transformer core, a transductor series connected with the compensation winding in a compensation current path, wherein the compensation current path has two parallel branches each containing a power winding of the transductor and an uncontrolled valve connected in series, where flow directions of the valves run counter to one another, and where each power winding is magnetically coupled to a control winding via a saturable transductor core, and includes a controller to which a detector supplies magnitude and direction information of the unidirectional flux component, and which generates a control variable supplied to each control winding such that the saturation state of the transductor core is variable such that a compensation current is formed in the compensation current path that counteracts the unidirectional flux component in the transformer core.

19 Claims, 3 Drawing Sheets

(51) Int. Cl.
*H01F 27/42* (2006.01)
*H04M 19/00* (2006.01)
*H01F 29/14* (2006.01)

US 9,941,046 B2

CIRCUIT ARRANGEMENT FOR REDUCING A UNIDIRECTIONAL FLUX COMPONENT IN THE SOFT-MAGNETIC CORE OF A TRANSFORMER

BACKGROUND OF THE INVENTION

1. Field of the Invention

The invention relates generally to the field of electrical transformers of the type used in power networks for the generation, transmission and distribution of electrical energy and, more particularly, to a circuit arrangement for reducing a unidirectional flux component in the soft-magnetic core of a transformer.

2. Description of the Related Art

It is known undesirable injection of direct current may occur for different reasons in networks for generating, transmitting and distributing electrical power, e.g., caused by power electronic switching units in the network. Such direct current, hereinafter also termed a DC component, results in a unidirectional flux component causing asymmetrical saturation of the magnetic core material of a transformer. This saturation increases the losses and operating noise of the transformer. Another possible cause are "geomagnetically induced currents" (GIC) that are an issue particularly for high-power transformers, because the no-load losses and no-load noise are significantly increased. Depending on the design of the transformer, even a very small DC component of a few 100 mA can increase the emission of operating noise by 10 to 20 dB. In the case of GIC, DC components of up to 50 A can occur. A significant increase in losses of some 20-30% may arise. Local heating in the transformer can severely reduce the useful life of the winding insulation.

Various methods and devices for reducing a unidirectional flux component in the core of a transformer are known. For example, EP 2 622 614 B1 describes the use of a switching unit to inject a compensation current into a compensation winding magnetically coupled to the transformer core. The effect of the compensation current counteracts the unidirectional flux component. Controlled valves, such as thyristors, are proposed for implementing the switching unit. However, the use of controlled semiconductor switches is currently limited in practice to around 690 V because of their maximum permissible voltage or, rather, power dissipation. However, in the case of transformers used in the context of high-voltage DC transmission (HVDCT), the voltage induced in the compensation winding can be well above these limit values and indeed exceed 8 kV. The practical use of thyristors in this high-voltage range is not only limited, but also requires a considerable outlay for cooling equipment to dissipate the switching losses. Moreover, comparatively complex control circuits are required for controlling controlled valves, which adversely affects reliability. For practicable unidirectional flux compensation, similar requirements apply as for power transformers themselves, e.g., the compensation device shall have a simple design and must provide low-maintenance operation over several decades.

SUMMARY OF THE INVENTION

It is an object of the present invention to provide a circuit arrangement for reducing a unidirectional flux component in the magnetic core of a transformer, where the circuit arrangement has a simple configuration and operates reliably over as long a service life as possible.

This and other objects and advantages are achieved in accordance with a circuit arrangement for reducing a unidirectional flux component in the soft-magnetic core of a transformer for generating a compensation current, where a circuit arrangement that does not require controlled valves is used.

In accordance with a first embodiment of the invention, the circuit arrangement comprises a compensation winding that is magnetically coupled to the core of the transformer, a transductor that is connected in series with the compensation winding in a compensation current path, where the compensation current path has two parallel branches in which the power winding of the transductor and an uncontrolled valve are each connected in, where the flow directions of the valves run counter to one another, and where each power winding is magnetically coupled to a control winding via a saturable transductor core, and a controller to which information about the magnitude and direction of the unidirectional flux component is provided on the input side and which, on the output side, generates a control variable that is supplied to each control winding such that the saturation state of the transductor core can be varied such that, in the compensation current path, a compensation current is formed whose effect counteracts the unidirectional flux component.

In a second embodiment in accordance with the invention, the circuit arrangement comprises a compensation winding that is magnetically coupled to the core of the transformer, a transductor having a power winding that is connected in series with the compensation winding in a compensation current path, where the compensation current path comprises an uncontrolled valve and a switching device for reversing the direction of current flow in the valve, and where the power winding is magnetically coupled to a control winding via a saturable transductor core, and a controller to which information provided by a detection device concerning the magnitude and direction of the unidirectional flux component ($\varphi_{DC}$) is provided on the input side and that generates on the output side a control variable which is supplied to the control winding such that the saturation state of the transductor core can be varied such that, in the compensation current path, a compensation current ($I_K$) is formed whose effect counteracts the unidirectional flux component ($\varphi_{DC}$) in the core of the transformer.

Using a transductor in conjunction with uncontrolled valves obviates the need for the complex control circuitry otherwise required for controlled valves. Compared to a thyristor, uncontrolled valves, such as a diode, are relatively robust and have a long service life. The transductor, which essentially consists of a magnetic core and a winding arrangement disposed thereon (comprising a single or pairwise arrangement of power winding and control winding), is similar in configuration to a transformer and is likely to provide a similarly long service life.

Implementation complexity is particularly low for the second embodiment. Here, there is no need for a complex control circuit of the kind required for electronically controlling controlled valves. The switching device for reversing the polarity of the single uncontrolled valve (diode) can be of a mechanical type and can be actuated by a drive.

With respect to the electrical on-state power losses, those of a diode are relatively low compared to the switching losses of a controlled valve, such that the overall cooling cost/complexity is much lower. Compared to controlled valves, such as thyristors, the limit values with to voltage and power dissipation for currently commercially available diodes are relatively higher. As a result, the use of a DC compensation device is no longer limited to low voltages, but its use is now also possible for high voltages for large power transformers, such as HVDCT transformers. Low-cost implementation is possible.

The components used in accordance with the contemplated embodiments of the invention are comparatively simple for both embodiments and are all likely to operate fault-free for many years.

In the preferred embodiment, the uncontrolled valve or the two uncontrolled valves are each configured as high-blocking power diodes.

In terms of low manufacturing costs, it may be advantageous for the circuit arrangement to have a transductor whose transductor core is implemented as a split strip core or in the form of stacked laminations.

Low power dissipation in the magnetic material of the transductor can be achieved by composing it of individual laminations made of a magnetic material having a rectangular hysteresis loop that is as narrow as possible. The drive power for the transductor is therefore low, which means that the controller can be of simpler design.

A further simplification of the controller can be achieved if the transductor core is disposed in a magnetic circuit having at least one air gap, so that the remnant flux density is limited to less than or equal to 20% of the saturation flux density.

To reduce the losses in the controller still further, it may be advantageous if a low-loss grain-oriented electrical steel, a grain-oriented (HiB-GOES) material, is used.

Particularly low-loss operation of the transductor can be achieved if the magnetic flux is carried in the direction of the rolling direction of the electrical steel in the soft-magnetic transductor core.

In order to limit the current in the compensation current path, a current limiting choke can be used, e.g., in series between transductor and compensation winding.

In a preferred embodiment of the switching device, the power winding (or windings) of the transductor is implemented with a sufficiently large leakage inductance such that it also simultaneously provides current limiting. The power winding (or windings) then simultaneously acts as a current limiting choke, and is therefore not present as a separate component.

In both cases, limitation of the maximum current in the current path is ensured, even if the controller of the transductor fails. The other current limiting measures to be provided in the controller can be of simpler design or dispensed with completely.

For high reliability and a long service life, it may be advantageous if components disposed in the power section, i.e., the compensation winding, the transductor, the valves and possibly the current limiting choke, are disposed inside the transformer tank. As result, these components of the circuit arrangement are bathed in and cooled by the insulating and cooling liquid of the transformer, which extends their service life.

For generating the compensation current, it may be advantageous for the phase of the voltage induced in the compensation winding to be detected using a measuring device and fed to the controller. This simplifies the generation of the compensation current.

Information concerning the magnitude and direction of the unidirectional flux component to be compensated can be acquired, e.g., via a measuring device disposed on the transformer core. Such a measuring device can be, for example, a magnetic sensor that is disposed in the shunt circuit on the transformer yoke or on a limb.

However, another possibility for providing information about the magnitude and direction of the unidirectional flux component to be compensated can also be obtained from the electrical grid itself. The information can be obtained via measurement instruments on the connecting cables of the transformer. Various devices for detecting a DC component are available to the person skilled in the art.

In a particularly preferred embodiment, a transformer having a primary winding and a secondary winding is provided for each control circuit (see FIG. 3), where each primary winding is supplied by the compensation winding, and where each secondary winding is assigned to a control circuit where it is incorporated such that the voltage induced in the respective control winding (1b) is compensated. This means that the space requirement for the circuit arrangement in accordance with the embodiments of the invention is low and highly differentiated compensation of an unwanted DC component is possible.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For further explanation of the invention, reference will be made in the following part of the description to drawings from which further advantageous embodiments, details and development of the invention will emerge based on an example, and in which.

DETAILED DESCRIPTION OF THE EXEMPLARY EMBODIMENTS

Figure 1:
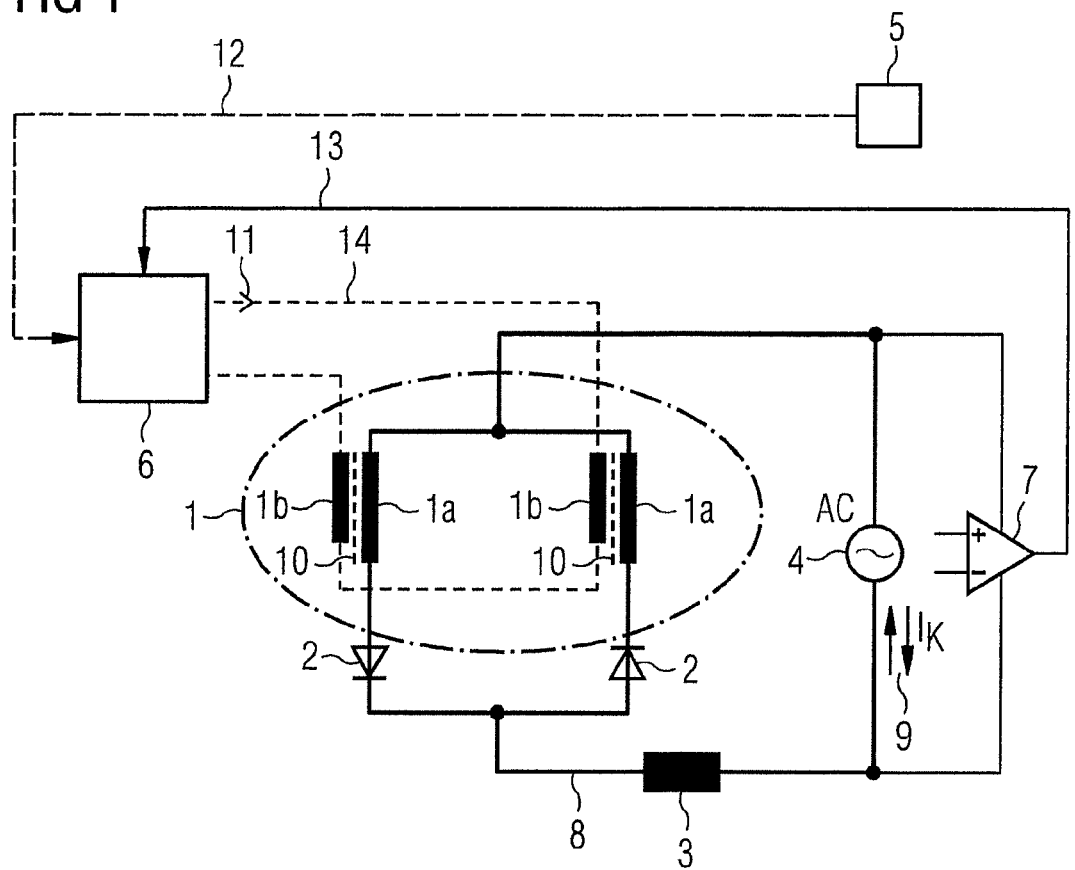
FIG. 1 schematically illustrates a first embodiment of the circuit arrangement in accordance with the invention.

FIG. 1 schematically illustrates a first embodiment of the circuit arrangement in accordance with the invention. Reference character 4 denotes a compensation winding that is magnetically coupled to the soft-magnetic core of a transformer. (For the sake of clarity, neither the magnetic core nor the other well-known components of the transformer are depicted in the drawings.)

As FIG. 1 shows, the compensation winding 4 is inserted in a compensation current path 8. The compensation current path 8, hereinafter also referred to as the power section (depicted using a heavy line thickness in FIGS. 1 to 3), splits into two parallel branches in the presently contemplated embodiment of the invention as shown in FIG. 1: each parallel branch contains a power winding 1a of a transductor 1. Connected in series with power winding 1a in each case is a valve 2. Each of these valves 2 is uncontrolled. The valves 2 are designed as semiconductor diodes. In the two parallel branches, the diodes 2 are connected in antiparallel, i.e., viewed in the circulation direction of the compensation current path 8, the flow direction of one diode 2 (the left-hand diode in FIG. 1) is counterclockwise, the diode 2 disposed in the right-hand parallel branch conducts in a clockwise direction.

As evident from FIG. 1, the transductor 1 has two power windings 1a and two control windings 1b. Each power winding 1a in a parallel branch is assigned a control winding 1b. Each of the two power windings 1a carries part of the compensation current $I_K$. The magnetic coupling between a power winding 1a and the control winding 1b assigned thereto creates a soft-magnetic transductor core 10 (show in simplified form as a broken line in FIG. 1). The transductor core 10 is a split strip core, but can also be laminated. The material for the transductor core 10 is a grain-oriented electrical steel grain-oriented (HiB-GOES). The hysteresis of this material is a narrow rectangular curve such that little switching power is required for controlling the transductor 1. In the transductor core 10, the magnetic flux is carried in the rolling direction of the electrical steel.

The two control windings 1b are connected in series in a control circuit 14. A controller 6 feeds a control variable 11 into this control circuit 14. As will be described in greater detail below, this control variable 11 causes different degrees of saturation of the magnetic material of the transductor core 10, as a result of which a current having a DC component is formed in the compensation current path 8. The DC component can be defined in magnitude and direction by the control variable 11 such that the unwanted unidirectional flux component $\varphi_{DC}$ (which arises from a DC component in the primary/secondary windings of transformer) is at least counteracted or, ideally, completely compensated.

On the input side, in FIG. 1, two signals are fed to the controller 6.

On the one hand, information 12 about the magnitude and direction of the unidirectional flux component $\varphi_{DC}$ to be compensated. As shown in FIG. 1, this information about the unwanted unidirectional flux component $\varphi_{DC}$ can be the signal of a detection device 5 that detects the unidirectional flux component $\varphi_{DC}$, e.g., at the yoke of the transformer. Particularly suitable is a bypass measuring system, described in PCT/EP 2010/054857, which essentially consists of a magnetic shunt section that is disposed on the transformer core such that a portion of the magnetic flux is branched off and carried in a shunt circuit so that a measurement signal corresponding to the unidirectional flux component $\varphi_{DC}$ can be determined using a sensor coil disposed on the shunt section. Such a magnetic field sensor is disposed in the transformer tank.

However, the information for reducing the effects of a unidirectional flux component $\varphi_{DC}$ can also come from another source, e.g., from the electrical grid itself, in which the GIC-DC component is measured in phase conductors of the grid—which is technically complex—or a GIC can be predicted or detected in some other way. In the schematic representation in FIG. 1, not all of this is shown for the sake of simplicity; the functional block 5 depicts a detection device in general which, on the input side, provides the controller 6 with the relevant information about the direction and magnitude of the disturbance variable via the measurement signal path 12.

On the other hand, FIG. 1 also shows another signal 13 that emanates from a detector 7 that provides the phase of the AC voltage induced in the compensation winding 4. In the embodiment depicted in FIG. 1, this signal 13 is likewise also used for generating the control variable 11, thereby enabling the complexity in the controller 6 to be minimized.

In this example, the controller 6 generates the control signal 11 as a function of these two input variables 12 and 13. This control signal is injected into the control circuit 14. The controller 6 therefore selectively controls the saturation state in the transductor 1, thereby predefining the switching behavior of the transductor 1. The number of outputs of the controller 6 is geared to the configuration of the transductor 1. The controller 6 contains a computer which, in this exemplary embodiment, also incorporates the functionality of an adaptive controller, thereby largely obviating the need for calibration in an expensive test facility. The control signal 11 is generated by suitable algorithms in the controller 6. Although the algorithm for generating the control variable 11 in the controller 6 can be simplified by using the phase information 13, the signal 13 is not absolutely necessary.

The transductor 1 is switched between a blocking and a conducting state by a current pulse in its control winding 1b. The transductor 1 maintains itself in the conducting state via the current in the power winding 1a until the zero crossing thereof and then automatically assumes the blocking state. The switching behavior of this "magnetic switch" therefore corresponds to that of a controlled valve, but without the disadvantages of the controlled valve. As a result, the control signal 11 influences the saturation state of the transductor core 10 such that a compensation current $I_K$ of pre-definable magnitude and direction obtains in the compensation current path 8. In FIG. 1, this is indicated by the double arrow 9.

Figure 2:
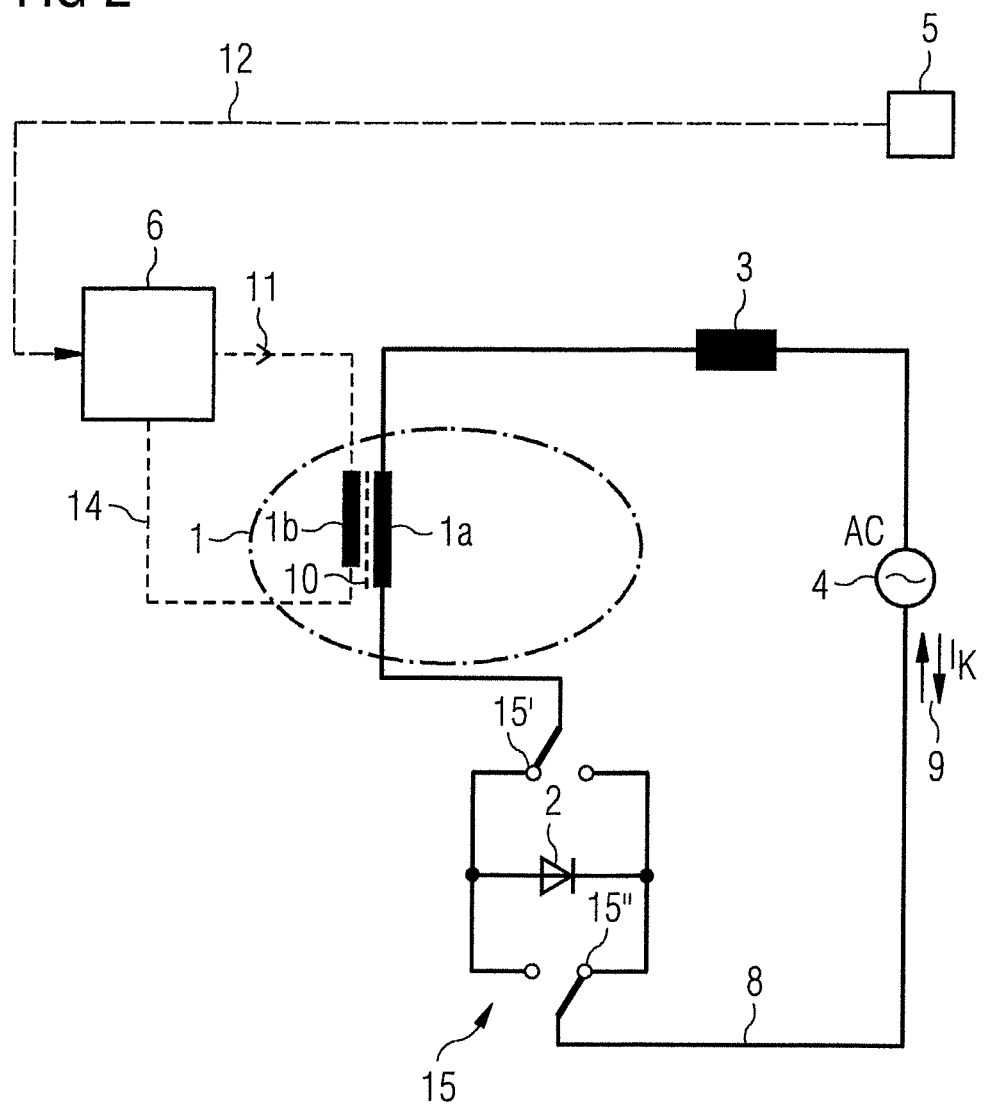
FIG. 2 schematically illustrates a second embodiment of the circuit arrangement in accordance with the invention.

FIG. 2 shows a second embodiment of the circuit arrangement in accordance with the invention. In contrast to the embodiment shown in FIG. 1, the transductor 1 consists of a single power winding and control winding 1a, 1b. In addition, there is no anti-parallel arrangement of two valves in the power path 8 (compensation current path), but only a single valve 2 which can be reversed in polarity in the current path 8 via a switching device 15. Here, the switching device 15 for reversing the polarity of the diode 2 is implemented as a mechanical switch that consists of two switching contacts 15' and 15". The switching contacts 15' and 15" are actuated by a drive unit (not shown in greater detail), e.g., by an electric drive. In the switching configuration in FIG. 2, the two switching contacts 15' and 15" are shown in a switch setting in which the compensation current $I_K$ is flowing counter-clockwise in the compensation current path 8. If the two switching contacts 15' and 15" are placed in their respective other setting, i.e., the first switching contact 15' is connected to the cathode and the switching contact 15" to the anode of the diode 2, then the flow direction of the compensation current $I_K$ in the compensation current path 8 changes. The compensation current $I_K$ in the switching diagram shown in FIG. 2 now flows in the opposite direction, i.e., in a clockwise direction. As already explained above with reference to FIG. 1, the unidirectional magnetic flux component in the core of a transformer is reduced via the "magnetic switch" 1. The transductor 1 is again controlled in the control phase 14 of a controller 6 by the control signal 11 such that a bidirectional compensation current $I_K$ (double arrow 9) begins to flow in the power section 8. The information about the disturbance to be compensated is fed to the controller 6 via the signal path 12. The compensation current $I_K$ is such that it reduces the undesirable effect of the unidirectional flux component $\varphi_{DC}$ in the core of the transformer. As a result, the unbalanced saturation and therefore also the power dissipation and noise emission of the transformer are reduced. A lower power dissipation, i.e., lower operating temperature, extends the service life of the transformer.

The advantage of the embodiment of circuit shown in FIG. 2 resides primarily in the compensation of higher compensation powers that require larger transductors and current limiting chokes. Here, it may be advisable to react to the changed polarity of the direct current by changing the polarity of the (single) uncontrolled rectifier 2. The circuit complexity is also lower in comparison to FIG. 1. Only one transductor needs to be provided, instead of two transductor coils for each polarity of the direct current to be compensated. Here, it may be advantageous in terms of availability and reliability to implement the switching device 15 as a mechanical switch. Implementing the switching device in this manner ensures high availability and operating reliability. Experience has shown that the polarity of a DC current to be compensated, such as a GIC, changes only very slowly. The mechanical switch 15 can therefore be actuated by a simple mechanism. This switch 15 is preferably disposed physically inside the transformer tank so that the insulating and cooling liquids inside the tank wash around its switching contacts 15', 15".

Figure 3:
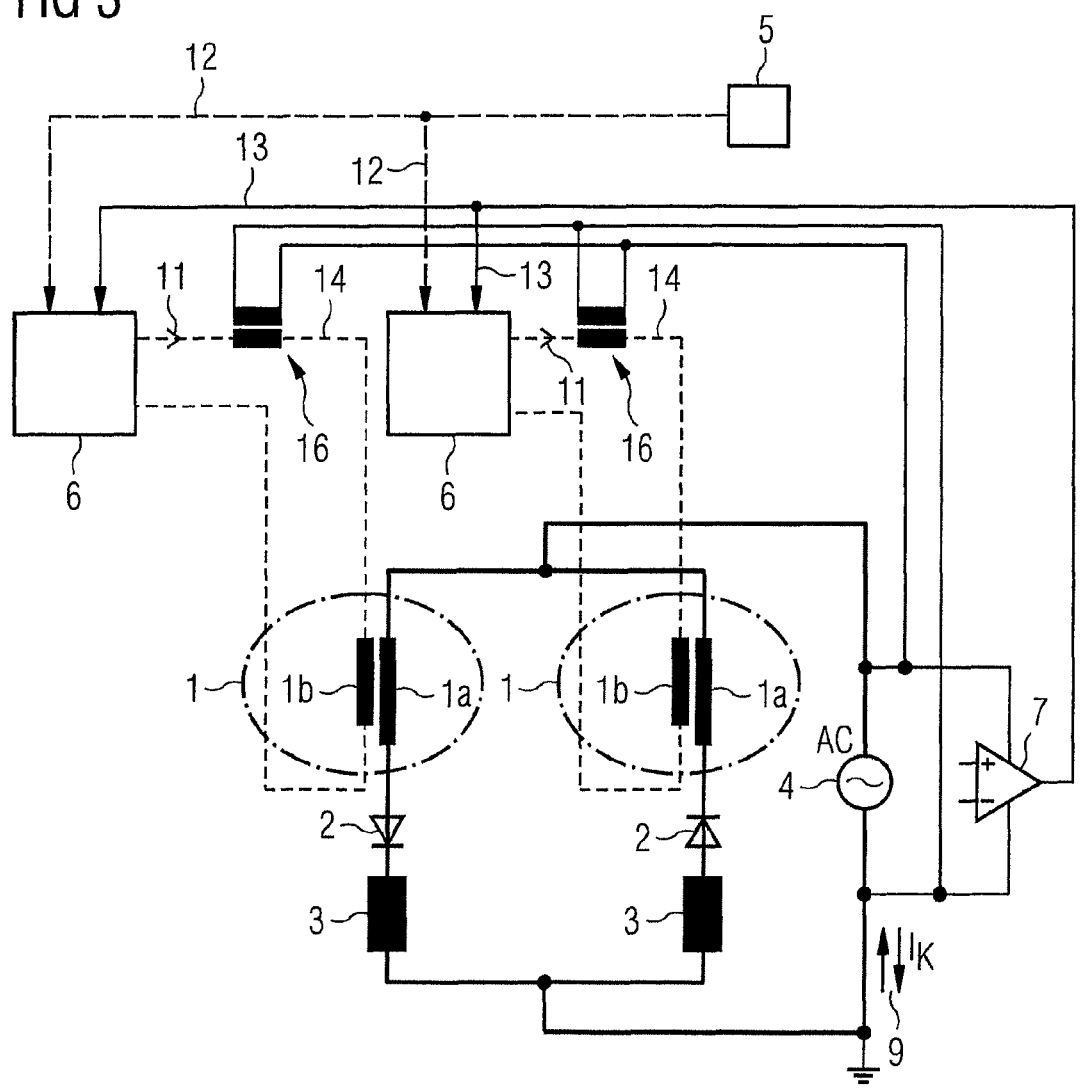
FIG. 3 schematically illustrates a preferred embodiment in accordance with the first embodiment of the invention.

FIG. 3 shows a preferred embodiment of the first embodiment of the invention. In contrast to FIG. 1, two completely separate transductors 1 are used that can also be activated separately by control units 6, depending on the polarity of the direct current to be compensated (GIC). Each control winding 1b is again controlled by a control signal 11 in the control circuit 14. The control signal 11 is provided by a controller 6 in each case. In A winding of a transformer 16 is incorporated in each of the two control circuits 14 for controlling the control windings 1b such that voltages induced in the control windings 1b are compensated. The advantage of this is that the control power is significantly reduced. As a result, the two controllers 6 can be of simpler configuration. The two transformers 16 are also implemented such that a leakage inductance is introduced in the respective control circuits 14 in each case, thereby increasing the stability of the respective controller 6. Another difference compared to FIG. 1 is that, in the embodiment in FIG. 3, the current limiting choke 3 is installed separately in each parallel branch. The advantage of this is that less space is required for the current limiting choke 3. However, in the embodiment illustrated in FIG. 3 it is also possible to integrate the choke 3 into the power winding 1a such that a sufficiently large leakage inductance is achieved. Separate current limiting is then no longer necessary. The implementation of the circuit arrangement according to the invention is then particularly advantageous.

In sum, the advantages arising from the disclosed embodiments of the invention are as follows:

The transductor in conjunction with uncontrolled valves constitutes a robust unit that operates reliably over a long service life.

The advantage of disposing the transductor and diode inside the tank of a transformer is that efficient cooling is possible. A complex cooling device is not required. Likewise, there is no need for a complex switchgear cabinet and associated power electronics.

The complete power section 8, i.e., the components disposed in the compensation current path, can be accommodated inside the transformer tank. The problem of ground faults in the external conductor arrangement of the power section is eliminated. Likewise eliminated are bushings that would otherwise be required for bringing out the power section. Devices for disconnecting the power sections, such as a cutout or contactor, are also not required.

The magnetically acting switch device, consisting of transductor and diode, is easily scalable for different voltages and powers. Inexpensive DC compensation can be implemented even for comparatively high voltages and powers. It is therefore now also possible for DC compensation to be used in large HVDCT transformers.

As the controller remains outside the tank, it can be inexpensively implemented within the scope of the EU Low Voltage Directive.

In the event of failure of a diode, it is not necessary for the transformer to be shut down by the grid.

The energy for generating this compensation current $I_K$ comes from the actual voltage induced in the compensation winding 4 (in FIG. 1 the compensation winding 4 is represented by the AC voltage source symbol). The compensation winding 4 therefore functions as an energy source. A separate energy source for generating the compensation current $I_K$ is not required. As shown in FIG. 1, the compensation current $I_K$ flows through the compensation winding 4 in both directions, which causes its associated magnetic flux component to counteract the unwanted unidirectional flux component $\varphi_{DC}$ in the core of the transformer depending on its direction. In FIG. 1, the bidirectional compensation current $I_K$ is indicated by a 2-way arrow pair 9.

In FIGS. 1 and 2, each uncontrolled valve 2 is implemented as a high-blocking power diode that has a high blocking capability and a low forward resistance. In terms of semiconductor technology, this is achieved by inserting a thin, low-doped intermediate layer between highly doped pn regions. As a result, the losses in this (uncontrolled) valve are lower as compared to a thyristor.

Although the invention has been explained and described in detail based on the above-presented, the invention is not limited to these examples. Other embodiments and variations are conceivable without departing from the basic concept of the invention.

The transductor 1, whose design is known per se, can be of different construction in respect of its core, e.g., consisting of two magnetic circuits or of one magnetic core with three limbs. Its winding arrangement can consist of two separately wound control coils 1a for each power section 1a, or a common control coil 1b for both power sections 1a.

The block diagram in FIGS. 1 and 2 shows a current limiting choke 3 in the compensation current path 8. As already illustrated above, this is not absolutely necessary, as this current limiting function can also be provided by a suitable implementation of the power winding(s) 1a of the transductor. In this case, the current limiting choke 3 shown in FIGS. 1 and 2 would be omitted.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those element steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A circuit arrangement for reducing a unidirectional flux component in a soft-magnetic core of a transformer, comprising:
   a compensation winding magnetically coupled to the soft-magnetic core of the transformer;
   a transductor having power windings connected in series with the compensation winding in a compensation current path, the compensation current path including two parallel branches each containing a power winding of the transductor and an uncontrolled valve connected in series, a flow directions of each uncontrolled valve being counter to one another, and each power winding being magnetically coupled to a respective control winding via a saturable transductor core; and
   a first controller to which information about a magnitude and direction of the unidirectional flux component provided by a detector is supplied on an input side, and which generates a control variable on an output side which is supplied to each respective control winding such that a saturation state of the transductor core is variable such that a compensation current is formed in the compensation current path to counteract the unidirectional flux component in the soft-magnetic core of the transformer.

2. A circuit arrangement for compensating a unidirectional flux component in a soft-magnetic core of a transformer, comprising:
   a compensation winding magnetically coupled to the soft-magnetic core of the transformer;
   a transductor having a power winding connected in series with the compensation winding in a compensation current path, an uncontrolled valve and a switching device being disposed in the compensation current path for reversing a polarity of a current flow direction in the uncontrolled valve, and the power winding being magnetically coupled to a control winding via a saturable transductor core;
   a controller to which information about a magnitude and direction of the unidirectional flux component provided by a detector is supplied on an input side, and which generates a control variable on an output side which is supplied to the control winding creating a variable saturation state of the transductor core such that a compensation current is formed in the compensation current path to counteracts the unidirectional flux component in the soft-magnetic core of the transformer.

3. The circuit arrangement as claimed in claim 1, wherein each uncontrolled valve comprises a high-blocking power diode.

4. The circuit arrangement as claimed in claim 2, wherein the uncontrolled valve comprises a high-blocking power diode.

5. The circuit arrangement as claimed in claim 1, wherein the transductor core comprises one of a split strip core and a stacked core.

6. The circuit arrangement as claimed in claim 2, wherein the transductor core comprises one of a split strip core and a laminated stacked core.

7. The circuit arrangement as claimed in claim 5, wherein the split strip or laminated stacked core is made of laminations of a magnetically soft material having an essentially narrow, rectangular hysteresis curve.

8. The circuit arrangement as claimed in claim 5, wherein the transductor core is disposed in a magnetic circuit having at least one air gap so that a remnant flux density is limited to less than or equal to 20% of a saturation flux density.

9. The circuit arrangement as claimed in claim 7, wherein the transductor core is disposed in a magnetic circuit having at least one air gap so that a remnant flux density is limited to less than or equal to 20% of a saturation flux density.

10. The circuit arrangement as claimed in claim 8, wherein the magnetically soft material is grain-oriented (HiB-GOES) electrical steel.

11. The circuit arrangement as claimed in claim 10, wherein the magnetic flux in the magnetically soft material is carried in a rolling direction of the HiB-GOES electrical steel.

12. The circuit arrangement as claimed in claim 1, wherein one of (i) at least one current limiting choke is connected in series between the transductor and the compensation winding in the compensation current path and (ii) the power winding is configured to provide current limiting.

13. The circuit arrangement as claimed in claim 1, wherein the compensation winding, the transductor, each uncontrolled valve and optionally at least one current limiting choke are disposed inside one of (i) an insulation-filled tank of a transformer and (ii) a cooling-liquid-filled tank of the transformer.

14. The circuit arrangement as claimed in claim 1, wherein a phase of voltage induced in the compensation winding is obtained via a measuring device and supplied to the controller.

15. The circuit arrangement as claimed in claim 1, wherein the information about the magnitude and direction of the unidirectional flux component is obtained via a measuring device disposed on the soft-magnetic core of the transformer.

16. The circuit arrangement as claimed in claim 1, wherein the information about the magnitude and direction of the unidirectional flux component is obtained via a measuring device disposed on connecting cables of the transformer.

17. The circuit arrangement as claimed in claim 1, further comprising:
   a second controller, a first transformer and a second transformer, each of the first and second transformers having a primary winding and a secondary winding;
   wherein each primary winding is supplied by the compensation winding, and each secondary winding is coupled to a respective one of the first and second controllers;
   wherein each secondary winding is incorporated into the respective first and second controllers such that a respective voltage induced in each respective control winding is compensated.

18. The circuit arrangement as claimed in claim 17, wherein the power winding of the transductor comprises a leakage inductance for providing current limiting.

19. The circuit arrangement as claimed in claim 17, wherein a current limiting choke is connected in series with the power winding of the transductor in each parallel branch.

* * * * *